(12) United States Patent
Sakai et al.

(10) Patent No.: US 6,914,481 B2
(45) Date of Patent: Jul. 5, 2005

(54) HIGH FREQUENCY POWER AMPLIFIER APPARATUS AND POWER AMPLIFIER MODULE USE THE SAME

(75) Inventors: Yukio Sakai, Hyogo (JP); Fumio Yasui, Fukushima (JP); Hisayoshi Kato, Gifu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/250,428

(22) PCT Filed: Nov. 20, 2002

(86) PCT No.: PCT/JP02/12118

§ 371 (c)(1),
(2), (4) Date: Dec. 9, 2003

(87) PCT Pub. No.: WO03/047094

PCT Pub. Date: Jun. 5, 2003

(65) Prior Publication Data

US 2004/0090266 A1 May 13, 2004

(30) Foreign Application Priority Data

Nov. 26, 2001 (JP) .................................... 2001-358789
Nov. 26, 2001 (JP) .................................... 2001-358790

(51) Int. Cl.[7] ............................................. H03G 3/20
(52) U.S. Cl. ....................................... 330/129; 330/297
(58) Field of Search .................................. 330/123, 127, 330/129, 278, 279, 285, 297

(56) References Cited

U.S. PATENT DOCUMENTS 6,307,429 B1 * 10/2001 Olgaard ....................... 330/129
6,384,686 B2 * 5/2002 Ueno et al. .................. 330/285
6,417,729 B1 * 7/2002 Lemay et al. ............... 330/129
6,636,114 B2 * 10/2003 Tsutsui et al. .............. 330/129

FOREIGN PATENT DOCUMENTS

| JP | 2703667 | 10/1997 |
| JP | 2996170 | 10/1999 |
| JP | 10-51323 | 12/1999 |
| JP | 2001-345648 | 12/2001 |

OTHER PUBLICATIONS

International Search Report corresponding to application No. PCT/JP02/12118 dated Mar. 11, 2003 (English translation provided).

* cited by examiner

*Primary Examiner*—Khanh V. Nguyen
(74) *Attorney, Agent, or Firm*—RatnerPrestia

(57) ABSTRACT

In a high frequency power amplifier apparatus of the present invention, ground terminal (17e) of automatic power control circuit (17) is connected to ground terminal (13c) of power amplifier (13) through inductive reactance element (18) for preventing frequency supplied from power amplifier (13). Noise occurring from automatic power control circuit (17) can be prevented from disturbing power amplifier (13).

16 Claims, 3 Drawing Sheets

HIGH FREQUENCY POWER AMPLIFIER APPARATUS AND POWER AMPLIFIER MODULE USE THE SAME

THIS APPLICATION IS A U.S. NATIONAL PHASE APPLICATION OF PCT INTERNATIONAL APPLICATION PCT/JP02/12118.

TECHNICAL FIELD

The present invention relates to a high frequency power amplifier apparatus used in a handy phone or an information communication terminal, and a power amplifier module using the high frequency power amplifier apparatus.

BACKGROUND ART

A conventional high frequency power amplifier apparatus is described. As shown in FIG. 4, the conventional high frequency power amplifier apparatus has the following elements:
input terminal 1;
power amplifier 2 for receiving a signal that has been fed into input terminal 1;
directional coupler 3 for receiving an output from power amplifier 2;
output terminal 4 for receiving an output from directional coupler 3; and
automatic power control circuit 5 of which input portion 5a is connected to coupling output terminal 3a of directional coupler 3 and output portion 5b is connected to power control terminal 2a of power amplifier 2.

Ground terminal 5c of automatic power control circuit 5 is connected to ground terminal 2b of power amplifier 2 through conductor 6 and then grounded.

Noise level is required to be low in a receiving band of an apparatus employing the high frequency power amplifier apparatus, but a noise characteristic of the receiving band is degraded in the conventional circuitry for the following reason. Since ground terminal 5c is connected to ground terminal 2b through conductor 6 and then grounded in this circuitry, noise generated by a signal from power amplifier 2 via automatic power control circuit 5 comes into power amplifier 2 through conductor 6 and ground terminal 2b and comes out of power amplifier 2 again, thereby degrading the noise characteristic.

DISCLOSURE OF THE INVENTION

The present invention provides a high frequency power amplifier apparatus having the following elements:
an input terminal;
a power amplifier for receiving a signal supplied from the input terminal;
a directional coupler for receiving an output from the power amplifier;
an output terminal for receiving an output from the directional coupler; and
an automatic power control circuit of which input portion is connected to a coupling output terminal of the directional coupler and output portion is connected to a power control terminal of the power amplifier. A ground terminal of the automatic power control circuit is connected to a ground terminal of the power amplifier through an inductive reactance element for preventing frequency supplied from the power amplifier.

DETAILED DESCRIPTION OF PREFERRED EMBODIMENTS

Exemplary embodiments of the present invention will be described hereinafter with reference to FIG. 1 to FIG. 3.

(Exemplary Embodiment 1)

Figure 1:
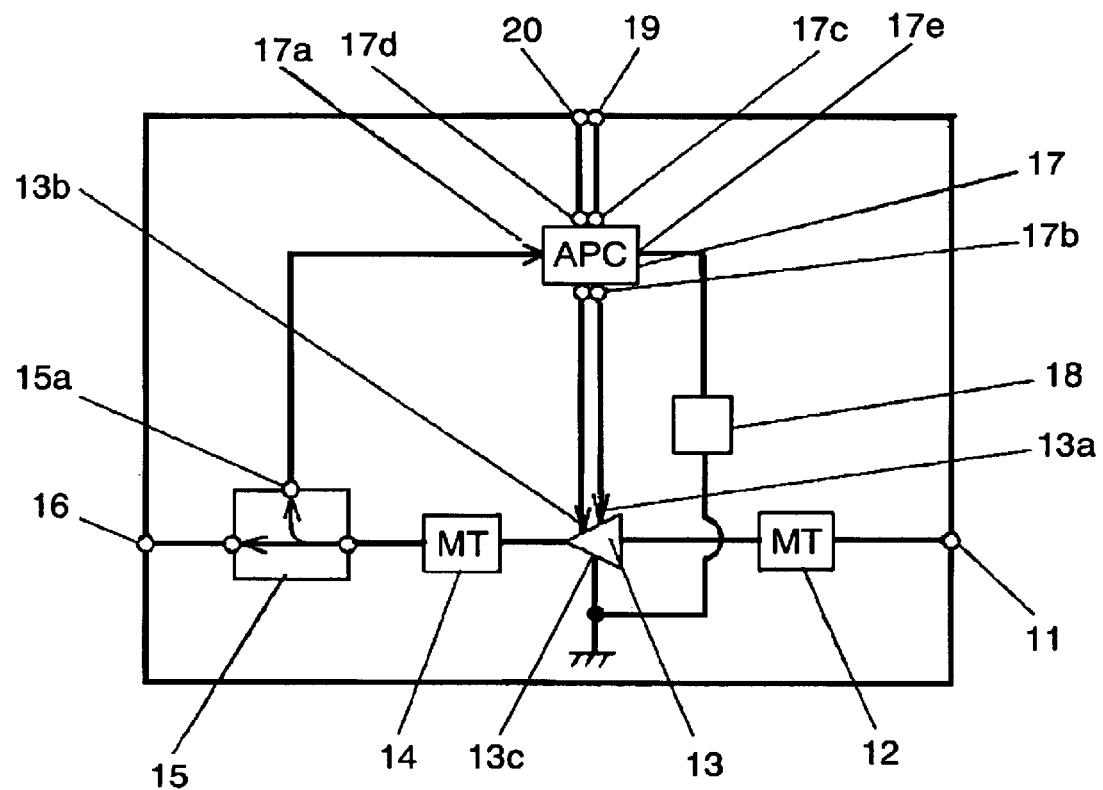
FIG. 1 is a block diagram of a high frequency power amplifier apparatus in accordance with exemplary embodiment 1 of the present invention.

FIG. 1 is a circuit diagram of a high frequency power amplifier apparatus in accordance with exemplary embodiment 1. In FIG. 1, the high frequency power amplifier apparatus has the following elements:
input terminal 11;
input matching circuit 12 connected to input terminal 11;
power amplifier 13 connected to an output portion of input matching circuit 12;
output matching circuit 14 connected to an output portion of power amplifier 13;
directional coupler 15 connected to an output portion of output matching circuit 14;
output terminal 16 connected to an output portion of directional coupler 15; and
automatic power control circuit 17 of which input portion 17a is connected to coupling output terminal 15a of directional coupler 15 and output portion 17b is connected to power control terminal 13a of power amplifier 13.

Control terminal 19 for controlling amplification degree of power amplifier 13 from the outside is connected to input portion 17c of automatic power control circuit 17. Control terminal 20 controls turning on or off of a power supply of power amplifier 13 from the outside, is connected to input portion 17d of automatic power control circuit 17, and is connected to power supply control terminal 13b of power amplifier 13 via automatic power control circuit 17.

Ground terminal 17e of automatic power control circuit 17 is connected to ground terminal 13c of power amplifier 13 through inductive reactance element 18. Inductive reactance element 18 prevents noise supplied from automatic power control circuit 17. Frequency of the noise comes from power amplifier 13 to automatic power control circuit 17.

In the high frequency power amplifier apparatus, a technology specialized in a high frequency circuit is modularized, and the power amplifier and its peripheral circuit that are used in a handy phone or an information communication terminal requiring an engineer specialized in the high frequency circuit are modularized and unified. The power amplifier and its peripheral circuit for the handy phone or the information communication terminal can be therefore designed without requiring the engineer specialized in the high frequency circuit.

In this circuitry, an additional ground terminal of automatic power control circuit 17 is not required, and the ground terminal of power amplifier 13 can be shared when the power amplifier and its peripheral circuit are modularized. The number of the ground terminals can be reduced.

Since ground terminal 17e of automatic power control circuit 17 is connected to ground terminal 13c of power amplifier 13 through inductive reactance element 18 for preventing the frequency supplied from power amplifier 13, noise is not transmitted to power amplifier 13 from automatic power control circuit 17 through the ground terminal differently from the prior art, and power amplifier 13 is not disturbed.

The noise of the high frequency power amplifier apparatus does not cause increase of the noise level of a receiving band in a receiving system, and thus the receiving sensitivity characteristic can be improved.

Inductive reactance element 18 can employ a winding coil, a coil formed in a print pattern, or a transmission line. In embodiment 1, a transmission line of ¼ wavelength of a frequency supplied from power amplifier 13 is employed. Thanks to the ¼ wavelength, the amplitude level of a noise signal is zero just at ground terminal 13c of power amplifier 13, and noise supplied from automatic power control circuit 17 does not disturb power amplifier 13. Length of the transmission line may be set at an odd number times larger than the ¼ wavelength of a disturbing frequency.

The coil formed in the print pattern may be used as inductive reactance element 18. The coil is formed of a pattern inductor, so that the coil can be thinned and prevents the noise supplied from the automatic power control circuit from disturbing the power amplifier. In this case, an effect substantially similar to the transmission line is produced.

The winding coil may be used as inductive reactance element 18. In this case, a parallel resonant circuit can be formed of a capacitance between windings of the coil. Therefore, by adjusting the inductance of the coil, the resonance frequency can be matched with the disturbing frequency and the disturbing noise can be accurately and efficiently removed.

Input matching circuit 12 is used, so that input impedance is set at 50 Ω, and a signal fed from input terminal 11 can be efficiently transmitted to power amplifier 13. Output matching circuit 14 is also disposed, so that an output of power amplifier 13 can be efficiently transmitted to directional coupler 15. Loss of a signal supplied from power amplifier 13 can be therefore reduced. In other words, less power consumption is required for the same output.

Directional coupler 15 employs intaglio printing, so that a Q value can be increased compared with etching. Loss of the signal supplied from power amplifier 13 can be therefore reduced. In other words, less power consumption is required for the same output.

The degree of coupling of directional coupler 15 is set between 10 and 20 dB, and level of a transmission signal outputted from coupling output terminal 15a of directional coupler 15 is set so that input portion 17a of automatic power control circuit 17 receives a signal having an appropriate level. An output portion of directional coupler 15 is connected to output terminal 16 and outputs the transmission signal.

Control terminal 19 can control the amplification degree of power amplifier 13, so that an appropriate output can be obtained depending on communication distance and the power consumption can be reduced. Power supply control terminal 20 can control turning on or off of the power supply of power amplifier 13, so that power amplifier 13 can be operated only in transmitting the signal to reduce the power consumption.

(Exemplary Embodiment 2)

Figure 2:
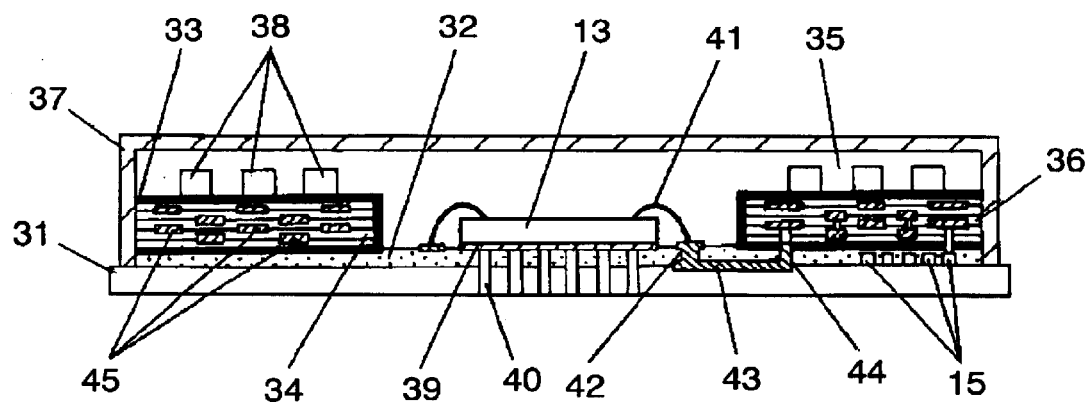
FIG. 2 is a sectional view of a high frequency power amplifier module in accordance with exemplary embodiment 2 of the present invention.
Figure 3:
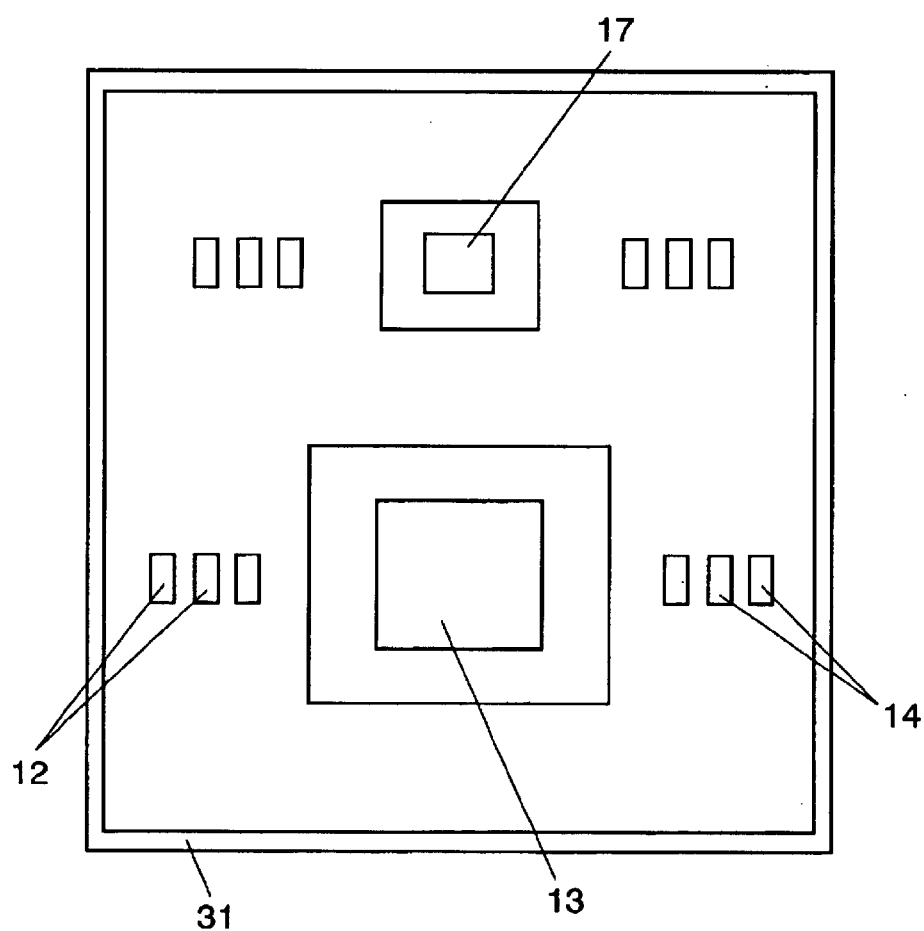
FIG. 3 is a plan view of the high frequency power amplifier module in accordance with exemplary embodiment 2 of the present invention.
Figure 4:
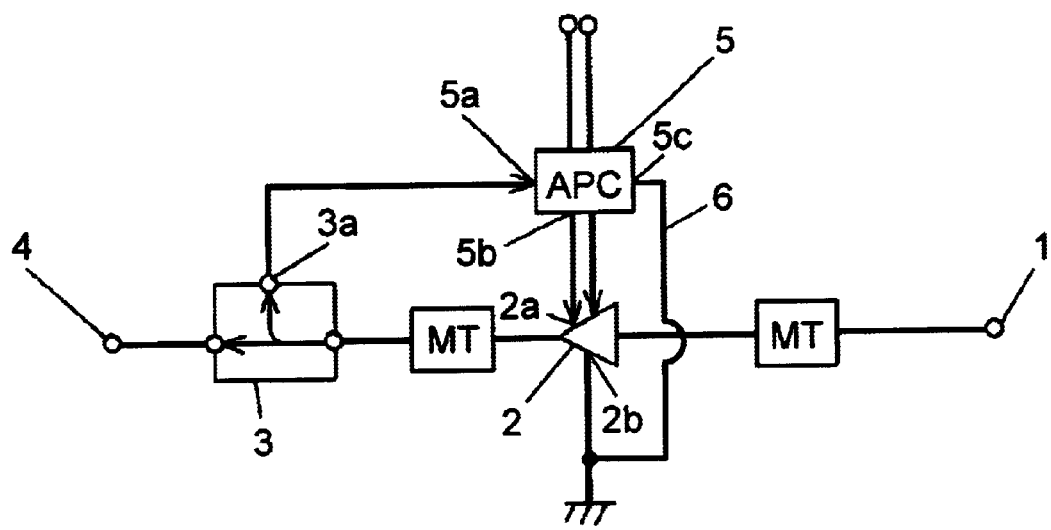
FIG. 4 is a block diagram of a conventional high frequency power amplifier apparatus.

FIG. 2 is a sectional view of a high frequency power amplifier module in accordance with exemplary embodiment 2 of the present invention. FIG. 3 is a plan view of the high frequency power amplifier module. In FIG. 2 and FIG. 3, inorganic glass 32 is laminated on the upper surface of alumina substrate 31, and power amplifier 13 is mounted to a substantially central part on inorganic glass 32.

Input circuits 12 or the like including components are disposed on baked substrate 34 on one side 33 of power amplifier 13. Output matching circuits 14 or the like including components are disposed on baked substrate 36 on the other side 35 of power amplifier 13. These components are covered with metallic shield case 37. Therefore, noise is not transmitted from an automatic power control circuit to the power amplifier through the ground terminal in the power amplifier module, and thus the noise does not disturb the power amplifier. This structure prevents the noise of the power amplifier from increasing the noise level of a receiving band and reducing the receiving sensitivity.

Alumina substrate 31 is mainly formed of alumina and has a relative dielectric constant of 9 to 11. Substrates 34 and 36 have a melting point temperature lower than that of alumina substrate 31. Substrates 34 and 36 are low-temperature baked substrates capable of being laminated like a green sheet, so called low temperature co-fired ceramics (LTCC) substrates. Low-temperature baked substrates 34 and 36 include built-in receiving components 45, and components 45 form parts of input matching circuit 12, output matching circuit 14, and automatic power control circuit 17.

Surface mounting components 38 form parts of input matching circuit 12, output matching circuit 14, and automatic power control circuit 17. Directional coupler 15 is formed in intaglio printing method, and has a Q value higher than that in a printing method using etching technology. Loss of the signal supplied from the power amplifier can be therefore reduced. In other words, less power consumption is required for the same output.

Printing pattern 39 is used for heat dissipation in embodiment 2. Printing pattern 39 having low thermal resistance disposed on inorganic glass 32 for supporting power amplifier 13 is used for efficiently dissipating heat generated in power amplifier 13, and promotes thermal diffusion to alumina substrate 31. Thermal via holes 40 are also formed under power amplifier 13, thereby increasing a heat dissipation effect of power amplifier 13. The heat of power amplifier 13 can be released out of alumina substrate 31 through thermal via holes 40, so that efficiency of power amplifier 13 is improved.

Thermal via holes 40 have a diameter of 0.1 to 0.5 mm. The diameter is limited not to exceed the thickness of alumina substrate 31, thereby preventing decrease of the strength of alumina substrate 31.

In this state, inductive reactance element 18 is constituted by a series circuit of ground wire 41 of power amplifier 13, first via hole 42 forming the ground terminal of power amplifier 13, transmission line 43, and second via hole 44 forming the ground terminal of automatic power control circuit 17. Inorganic glass 32 prevents the short circuit in alumina substrate 31 and low-temperature baked substrates 34, 36.

This circuitry can provide the high frequency power amplifier module having the heat dissipation effect and low receiving noise level.

As discussed above, in the present invention, the ground terminal of the automatic power control circuit is connected to the ground terminal of the power amplifier through the inductive reactance element for preventing frequency supplied from the power amplifier. The noise is not therefore transmitted from the automatic power control circuit to the power amplifier and does not disturb the power amplifier.

The noise of the high frequency power amplifier module is prevented from increasing the noise level in the receiving band, and the receiving sensitivity characteristic can be improved.

INDUSTRIAL APPLICABILITY

The present invention relates to a high frequency power amplifier apparatus used in a handy phone or an information communication terminal, and provides the high frequency power amplifier module in which noise occurring via an automatic power control circuit does not disturb a power amplifier.

What is claimed is:

1. A high frequency power amplifier apparatus comprising:
   an input terminal;
   a power amplifier for receiving a signal supplied from said input terminal;
   a directional coupler for receiving an output from said power amplifier;
   an output terminal for receiving an output from said directional coupler; and
   an automatic power control circuit, an input portion of said automatic power control circuit being connected to a coupling output terminal of said directional coupler, an output portion of said automatic power control circuit being connected to a power control terminal of said power amplifier,
   wherein a ground terminal of said automatic power control circuit is connected to a ground terminal of said power amplifier through an inductive reactance element for preventing frequency supplied from said power amplifier.

2. A high frequency power amplifier apparatus according to claim 1,
   wherein the inductive reactance element comprises a transmission line having a length substantially equal to one of ¼ wavelength of a frequency supplied from said power amplifier and an odd number times larger than the ¼ wavelength.

3. A high frequency power amplifier apparatus according to claim 1,
   wherein the inductive reactance element comprises a pattern inductor.

4. A high frequency power amplifier apparatus according to claim 1,
   wherein the inductive reactance element comprises a winding coil.

5. A high frequency power amplifier apparatus according to claim 1,
   wherein said directional coupler is formed by intaglio printing.

6. A high frequency power amplifier apparatus according to claim 1,
   wherein an input matching circuit is disposed between said input terminal and said power amplifier.

7. A high frequency power amplifier apparatus according to claim 1,
   wherein an output matching circuit is disposed between said power amplifier and said directional coupler.

8. A high frequency power amplifier apparatus according to claim 1,
   wherein said power control terminal is connected to said automatic power control circuit, and an amplification degree of said power amplifier is controlled with an output of said automatic power control circuit.

9. A high frequency power amplifier apparatus according to claim 1,
   wherein said power control terminal is connected to said automatic power control circuit, and turning on or off of a power supply of said power amplifier is controlled with an output of said automatic power control circuit.

10. A power amplifier module including a high frequency power amplifier apparatus in one multilayer substrate, said high frequency power amplifier module comprising:
    an input terminal;
    a power amplifier for receiving a signal supplied from the input terminal;
    a directional coupler for receiving an output from the power amplifier;
    an output terminal for receiving an output from the directional coupler; and
    an automatic power control circuit, an input portion of the automatic power control circuit being connected to a coupling output terminal of the directional coupler, an output portion of the automatic power control circuit being connected to a power control terminal of the power amplifier,
    wherein a ground terminal of the automatic power control circuit is connected to a ground terminal of the power amplifier through an inductive reactance element for preventing frequency supplied from the power amplifier.

11. A power amplifier module according to claim 10,
    wherein a component mounting surface of the multilayer substrate is covered with a shield case.

12. A power amplifier module according to claim 10,
    wherein the power amplifier is mounted to the upper surface of an alumina substrate via inorganic glass, and heat of the power amplifier is released to the back surface of the alumina substrate from the power amplifier through a thermal via hole.

13. A power amplifier module according to claim 12,
    wherein a printing pattern is disposed on the inorganic glass for supporting the power amplifier.

14. A power amplifier module according to claim 12,
    wherein diameter of the thermal via hole is set to be smaller than thickness of the multilayer substrate.

15. A power amplifier module according to claim 12,
    wherein a low-temperature baked substrate is disposed on the upper surface of the inorganic glass, and the automatic power control circuit is disposed on the low-temperature baked substrate.

16. A power amplifier module according to claim 12,
    wherein the directional coupler is disposed on the upper surface of the alumina substrate and is formed by intaglio printing.

* * * * *